US012641994B2

(12) United States Patent
Fan et al.

(10) Patent No.: US 12,641,994 B2
(45) Date of Patent: May 26, 2026

(54) DISPLAY PANEL, MANUFACTURING METHOD THEREFOR, AND DISPLAY DEVICE

(71) Applicant: BOE Technology Group Co., Ltd., Beijing (CN)

(72) Inventors: Yibing Fan, Beijing (CN); Jing Wang, Beijing (CN); Meng Zhao, Beijing (CN); Liangjian Li, Beijing (CN); Zheng Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 629 days.

(21) Appl. No.: 17/791,061

(22) PCT Filed: Sep. 1, 2021

(86) PCT No.: PCT/CN2021/115894
§ 371 (c)(1),
(2) Date: Jul. 6, 2022

(87) PCT Pub. No.: WO2022/088945
PCT Pub. Date: May 5, 2022

(65) Prior Publication Data
US 2023/0014543 A1      Jan. 19, 2023

(30) Foreign Application Priority Data

Oct. 27, 2020    (CN) .......................... 202011162233.3

(51) Int. Cl.
*H01L 27/32*        (2006.01)
*H10K 59/122*      (2023.01)
(Continued)

(52) U.S. Cl.
CPC ......... *H10K 71/221* (2023.02); *H10K 59/122* (2023.02); *H10K 59/8723* (2023.02);
(Continued)

(58) Field of Classification Search
CPC .. H10K 59/122; H10K 59/1201; H10K 59/88; H10K 71/221
(Continued)

(56) References Cited

U.S. PATENT DOCUMENTS 10,790,346 B2      9/2020  Choi et al.
10,923,543 B1      2/2021  Chen
(Continued)

FOREIGN PATENT DOCUMENTS

CN          107293572 A      10/2017
CN          111063705 A       4/2020
(Continued)

OTHER PUBLICATIONS

CN202011162233.3 first office action.

*Primary Examiner* — Dzung Tran
(74) *Attorney, Agent, or Firm* — IPro, PLLC

(57) ABSTRACT

The display panel includes: a substrate; a pixel defining layer, arranged on the substrate, and comprising a plurality of opening regions arranged in an array; a light-emitting layer, configured to cover at least the plurality of opening regions; and an interval layer, arranged on the pixel defining layer and disconnected from an adjacent light-emitting layer.

5 Claims, 7 Drawing Sheets

(51) Int. Cl.

| | | |
|---|---|---|
| *H10K 59/80* | (2023.01) | |
| *H10K 71/00* | (2023.01) | |
| *H10K 71/20* | (2023.01) | |
| *H10K 59/12* | (2023.01) | |
| *H10K 59/35* | (2023.01) | |
| *H10K 59/88* | (2023.01) | |

(52) U.S. Cl.
CPC ......... *H10K 71/00* (2023.02); *H10K 59/1201* (2023.02); *H10K 59/351* (2023.02); *H10K 59/352* (2023.02); *H10K 59/88* (2023.02)

(58) Field of Classification Search
USPC .......................................................... 257/88
See application file for complete search history.

(56) References Cited

U.S. PATENT DOCUMENTS

2007/0252518 A1* 11/2007 Lee ...................... H10K 71/135
313/504

2015/0243676 A1* 8/2015 Jung .................. H10K 59/8723
257/72
2017/0025486 A1* 1/2017 Kwon ................ H10K 50/8428
2017/0250236 A1* 8/2017 Xiong ................... H10K 50/11
2018/0301519 A1* 10/2018 Ma ....................... H10K 50/816
2018/0301521 A1* 10/2018 Yang .................... H10K 59/35
2018/0331164 A1* 11/2018 Hsu ....................... H10K 71/00
2020/0119114 A1 4/2020 Kim et al.
2020/0176533 A1* 6/2020 Park ................... H10K 50/805

FOREIGN PATENT DOCUMENTS

| CN | 111192904 A | 5/2020 |
|---|---|---|
| CN | 111276512 A | 6/2020 |
| CN | 112349760 A | 2/2021 |
| CN | 112838103 A | 5/2021 |

* cited by examiner

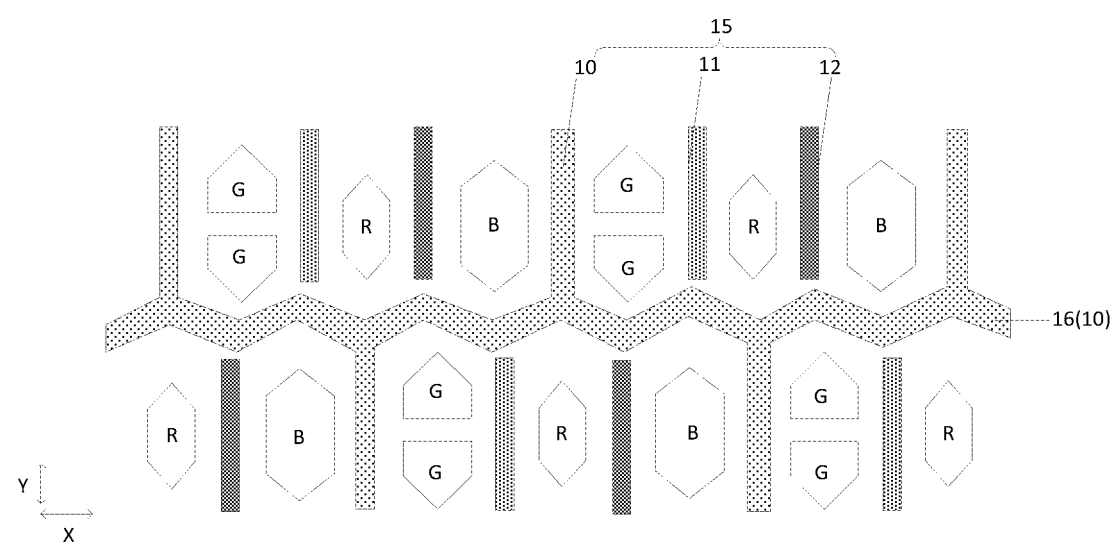

Fig. 6

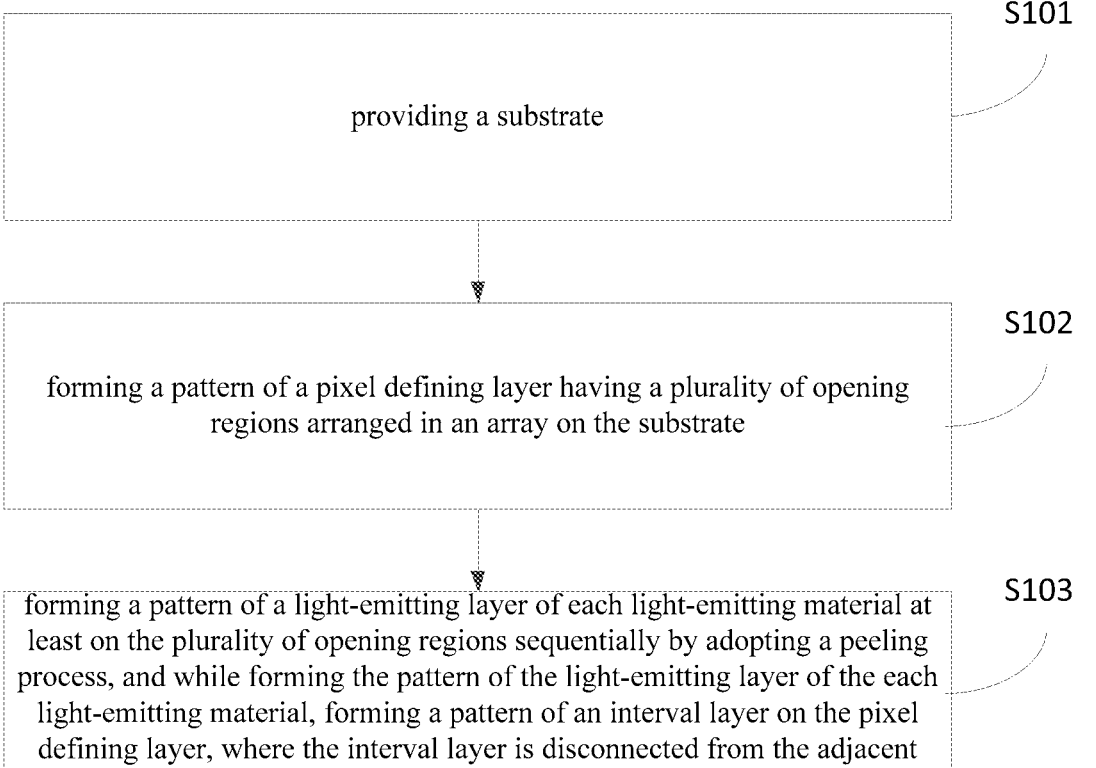

S101 providing a substrate

S102 forming a pattern of a pixel defining layer having a plurality of opening
regions arranged in an array on the substrate

S103 forming a pattern of a light-emitting layer of each light-emitting material at
least on the plurality of opening regions sequentially by adopting a peeling
process, and while forming the pattern of the light-emitting layer of the each
light-emitting material, forming a pattern of an interval layer on the pixel
defining layer, where the interval layer is disconnected from the adjacent
light-emitting layer

Fig. 7

DISPLAY PANEL, MANUFACTURING METHOD THEREFOR, AND DISPLAY DEVICE

CROSS REFERENCE TO RELATED APPLICATIONS

The present application is a national phase entry under 35 U.S.C § 371 of International Application No. PCT/CN2021/115894, filed Sep. 1, 2021, which claims priority to Chinese Patent Application No. 202011162233.3, entitled "DISPLAY PANEL, MANUFACTURING METHOD THEREFOR, AND DISPLAY DEVICE", and filed to the China National Intellectual Property Administration on Oct. 27, 2020, the entire contents of which are incorporated herein by reference.

FIELD

The present disclosure relates to the field of display, in particular to a display panel and a manufacturing method therefor, and a display device.

BACKGROUND

In a pixel typesetting scheme of display of an organic light-emitting diode (OLED) in the prior art, a photo pattern typesetting technology, with its characteristics of high resolution and high accuracy, has very obvious advantages in the manufacturing process of products with a high pixel density (i.e., pixel per inch, PPI) and a high aperture ratio.

The photo pattern for typesetting OLED pixels relies on a peeling technology to achieve patterning of a light-emitting film layer of each subpixel by peeling a film layer in a non-target region. However, in the peeling process, an area of the non-target region is large, the time for peeling is long, and the contact time between a peeling solution and EL is prolonged, which affects a working stability of the OLED.

SUMMARY

Embodiments of the present disclosure provide a display panel and a manufacturing method therefor, and a display device, for use in reducing the peeling time in a light-emitting layer manufacturing process, reducing damages to a light-emitting material in a peeling process, and also preventing color crossing between different subpixels.

The embodiments of the present disclosure provide a display panel, the display panel includes:

a substrate;

a pixel defining layer, located on the substrate, and including a plurality of opening regions arranged in an array;

a light-emitting layer, arranged on the substrate at least in the plurality of opening regions; and an interval layer, arranged on the pixel defining layer and disconnected from an adjacent light-emitting layer.

In some embodiments, the display panel further includes: a common layer, arranged between the substrate and the light-emitting layer and between the pixel defining layer and the interval layer.

In some embodiments, a light-emitting material of the interval layer is different from a light-emitting material of at least one light-emitting layer adjacent to the interval layer.

In some embodiments, the light-emitting material of the interval layer is different from light-emitting material of the light-emitting layer adjacent to the interval layer.

In some embodiments, the plurality of opening regions are arranged in a first direction and a second direction, and the first direction intersects with the second direction; and the interval layer includes: a first interval layer arranged between two adjacent opening regions in the first direction, and a second interval layer arranged between two adjacent opening regions in the second direction.

In some embodiments, a light-emitting material of the first interval layer is different from light-emitting material of the light-emitting layer adjacent to the first interval layer; and light-emitting materials of plurality of second interval layers are the same and are integrally connected, and the plurality of second interval layers are integrally connected to the first interval layer having the same light-emitting materials as the plurality of second interval layers.

In some embodiments, a size of a gap between any one of the adjacent light-emitting layers and the interval layer ranges from 1 micrometer to 2 micrometers.

The embodiments of the present disclosure provide a method manufacturing for a display panel, the method includes:

providing a substrate;

forming a pattern of a pixel defining layer having a plurality of opening regions in an array arrangement on the substrate; and forming a pattern of a light-emitting layer of each light-emitting material at least on the plurality of opening regions sequentially by adopting a peeling process, and while forming the pattern of the light-emitting layer of the each light-emitting material, forming a pattern of an interval layer on the pixel defining layer, wherein the interval layer is disconnected from the adjacent light-emitting layer.

In some embodiments, before forming a pattern of a light-emitting layer of each light-emitting material at least on the plurality of opening regions sequentially by adopting a peeling process, and while forming the pattern of the light-emitting layer of the each light-emitting material, forming the pattern of the interval layer on the pixel defining layer, the method further includes:

forming a common layer covering the plurality of opening regions and the pixel defining layer by adopting an evaporation process.

In some embodiments, forming the pattern of the light-emitting layer of the each light-emitting material at least on the plurality of opening regions sequentially by adopting the peeling process, includes:

forming the pattern of the light-emitting layer of the each light-emitting material by sequentially adopting following steps;

forming an isolation layer covering an opening regions and the pixel defining layer;

forming a first opening in the opening region corresponding to a light-emitting material of a light-emitting layer to be evaporated by performing a patterning process on the isolation layer;

evaporating the light-emitting material in a whole surface mode, forming a pattern of the light-emitting layer in the first opening, and forming a light-emitting layer to be removed on the isolation layer; and peeling the isolation layer by adopting a peeling solution to remove the light-emitting layer to be removed.

In some embodiments, the while forming the pattern of the light-emitting layer of the each light-emitting material, forming the pattern of the interval layer on the pixel defining layer, specifically includes:

performing the patterning process on the isolation layer, and while forming the first opening in the opening region corresponding to the light-emitting material of the light-emitting layer to be evaporated, forming a second opening exposing part of the pixel defining layer, wherein the light-emitting material of the light-emitting layer corresponding to at least one opening region adjacent to the second opening is different from the light-emitting material of the light-emitting layer currently to be evaporated; and forming the pattern of the light-emitting layer in the first opening by evaporating the light-emitting material in the whole surface mode, and while forming the light-emitting layer to be removed on the isolation layer, forming the pattern of the interval layer in the second opening.

The embodiments of the present disclosure provide a display device, and the display device includes the display panel provided by the embodiments of the present disclosure.

BRIEF DESCRIPTION OF THE DRAWINGS

In order to illustrate the technical solutions in the embodiments of the present disclosure more clearly, the following will briefly introduce the accompanying drawings needed in the description of the embodiments, obviously, the accompanying drawings in the following description are only some embodiments of the present disclosure, for those of ordinary skill in the art, without creative work, other accompanying drawings can be acquired from these accompanying drawings.

FIG. 6 is a schematic structural diagram of yet another display panel provided by an embodiment of the present disclosure.

FIG. 7 is a schematic diagram of a method for manufacturing a display panel provided by an embodiment of the present disclosure.

DETAILED DESCRIPTION OF THE EMBODIMENTS

In order to make objectives, technical solutions and advantages of embodiments of the present disclosure clearer, technical solutions of the embodiments of the present disclosure will be clearly and completely described below with reference to the accompanying drawings of the embodiments of the present disclosure. Obviously, the described embodiments are some, but not all, embodiments of the present disclosure. Moreover, under the condition of no conflict, the embodiments in the present disclosure and the features in the embodiments can be combined with each other. Based on the embodiments in the present disclosure, all other embodiments acquired by those of ordinary skill in the art without creative work shall fall within the protection scope of the present disclosure.

Unless otherwise defined, technical or scientific terms used herein should have the ordinary meaning as understood by those of ordinary skill in the art to which the present disclosure belongs. The terms "first", "second" and the like used in the description and claims of the present disclosure do not denote any order, quantity or importance, but are only used to distinguish different components. "Comprise" or "include" and similar words mean that the elements or objects appearing before the word encompass the elements or objects recited after the word and their equivalents, but do not exclude other elements or objects. Similar words such as "connect" or "link" are not limited to physical or mechanical connection, but may include electrical connection, whether direct or indirect.

It should be noted that the sizes and shapes of various patterns in the accompanying drawings do not reflect the true ratio, and are only intended to illustrate the content of the present disclosure schematically. In addition, the same or similar numerals refer to the same or similar elements or elements having the same or similar functions throughout.

Figure 1:
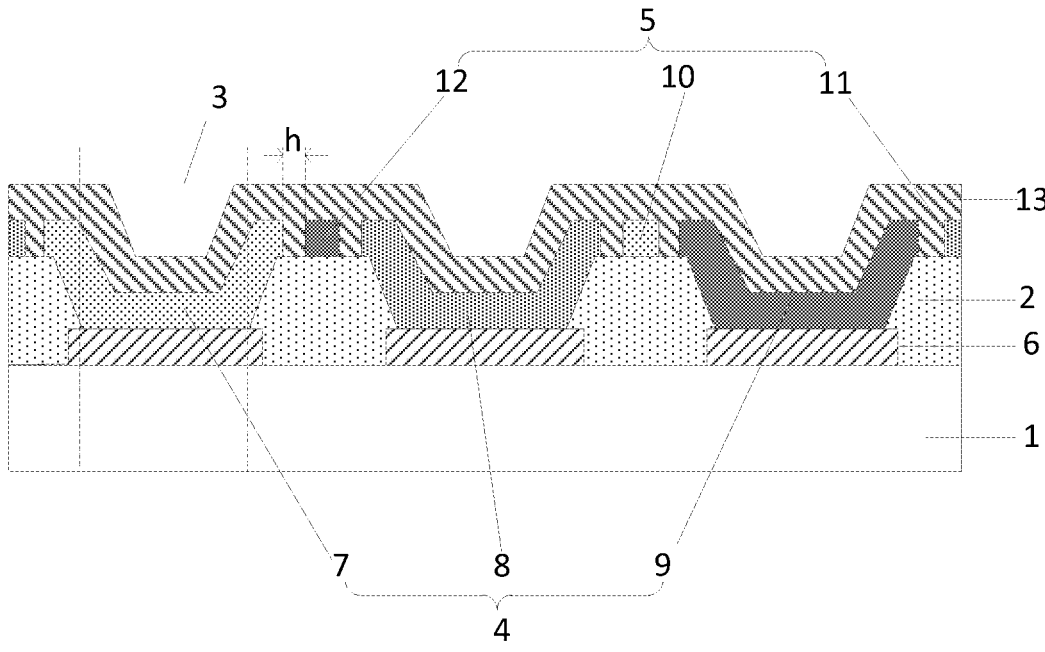
FIG. 1 is a schematic structural diagram of a display panel provided by an embodiment of the present disclosure.

The embodiments of the present disclosure provide a display panel. As shown in FIG. 1, the display panel includes:

a substrate 1;

a pixel defining layer 2, arranged on the substrate 1, and including a plurality of opening regions 3 arranged in an array;

a light-emitting layer 4, arranged on the substrate 1 at least in the plurality of opening regions 3; and an interval layer 5, arranged on the pixel defining layer 2 and disconnected from an adjacent light-emitting layer 4.

It should be noted that the display panel provided by the embodiments of the present disclosure, for example, may be manufactured by a photo pattern typesetting technology, that is, a pattern of the light-emitting layer is formed by adopting a peeling process. For the light-emitting layer of each light-emitting material, in the peeling process, it is usually necessary to form an isolation layer covering a corresponding opening region and a corresponding pixel defining layer, a subpixel opening is formed in a subpixel region corresponding to the light-emitting layer of the each light-emitting material, a dummy pixel opening is formed in a region of part of the pixel defining layer, then the light-emitting material is evaporated in a whole surface mode to form the pattern of the light-emitting layer in the subpixel opening and form the pattern of the interval layer in the dummy pixel opening, the light-emitting layer is formed on the isolation layer, and then the isolation layer is peeled by using a peeling solution, so that the light-emitting layer formed on the isolation layer is removed, and the light-emitting layer and the interval layer are remained. The formation of the dummy pixel opening may reduce an area of the isolation layer that is actually peeled off, so that peeling time is shortened, and damages to the light-emitting material in the peeling process are reduced.

In the display panel provided by the embodiments of the present disclosure, in the process of forming the light-emitting layer by adopting the peeling process, the formation of the interval layer may reduce a peeling area and shorten the peeling time, the damages to the light-emitting material in the peeling process are reduced, and at the same time, the interval layer is disconnected from the adjacent light-emitting layer, so as to avoid a color crossing problem between different subpixels and improve a display effect.

It should be noted that, as shown in FIG. 1, the light-emitting layer extends above the pixel defining layer, and is disconnected from the interval layer arranged on the pixel defining layer.

Figure 2:
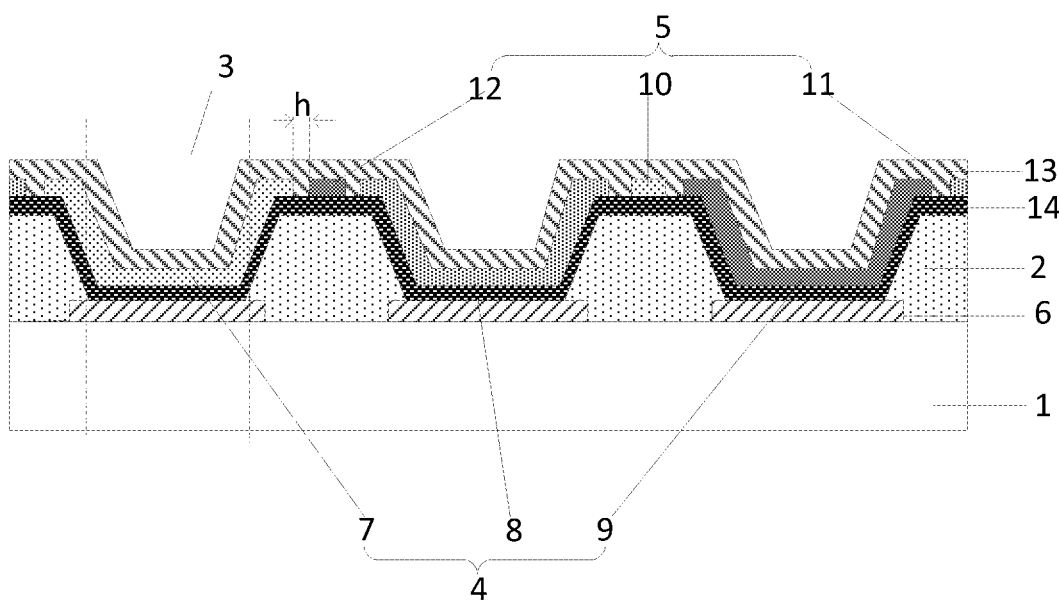
FIG. 2 is a schematic structural diagram of another display panel provided by an embodiment of the present disclosure.

In some embodiments, as shown in FIG. 2, the display panel further includes:

a common layer 14, integrally formed between the substrate 1 and the light-emitting layer 4 and between the pixel defining layer 2 and the interval layer 5.

In some embodiments, the common layer includes one or a combination of the following: an electron injection layer and an electron transport layer.

In the display panel provided by the embodiments of the present disclosure, the common layer is integrally formed between the substrate and the light-emitting layer and between the pixel defining layer and the interval layer. Compared with a common layer formed by subpixels of different colors respectively, a manufacturing process of the display panel may be simplified, manufacturing time of the display panel is saved, and costs are saved. Moreover, since the interval layer is disconnected from the adjacent light-emitting layer, even if the common layer between different subpixels is integrally formed, there will be no risk of color crossing.

In some embodiments, as shown in FIG. 1 and FIG. 2, a size of a gap h between the adjacent light-emitting layer 4 and the interval layer 5 ranges from 1 micrometer to 2 micrometers.

In the display panel provided by the embodiments of the present disclosure, the size of the gap between a light-emitting layer and the interval layer adjacent to the light-emitting ranges from 1 micrometer to 2 micrometers, so that the light-emitting layer can be prevented from being in contact with the interval layer adjacent thereto, it is ensured that the light-emitting layer is disconnected from the interval layer, and the color crossing problem between different subpixels is avoided.

In the display panel provided by the embodiment of the present disclosure, the plurality of opening regions of the pixel defining layer correspond to a plurality of subpixel openings, the subpixels include: a red subpixel, a blue subpixel and a green subpixel, and the plurality of opening regions include: a first opening region corresponding to the red subpixel, a second opening region corresponding to the blue subpixel, and a third opening region corresponding to the green subpixel. Correspondingly, as shown in FIG. 1 and FIG. 2, the light-emitting layer 4 includes: a red light-emitting layer 7, a blue light-emitting layer 8 and a green light-emitting layer 9, and the interval layer 5 includes: a red light interval layer 10, a blue light interval layer 11 and a green light interval layer 12.

In some embodiments, in the display panel provided by the embodiments of the present disclosure, the interval layer is arranged between at least a part of the adjacent subpixels.

Figure 3:
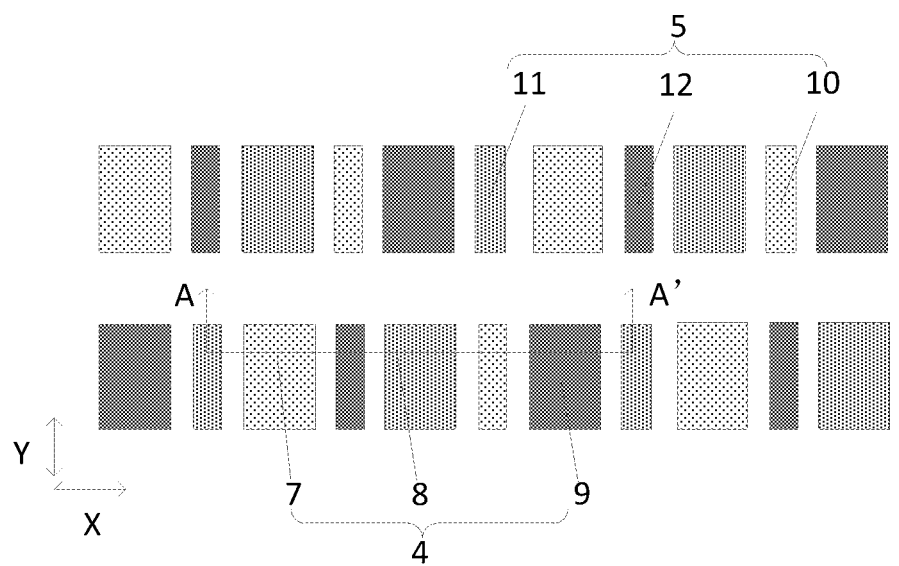
FIG. 3 is a schematic structural diagram of yet another display panel provided by an embodiment of the present disclosure.

In some embodiments, orthographic projections of plurality of light-emitting layers and plurality of interval layers on the substrate are as shown in FIG. 3, and an interval layer 5 is arranged between two adjacent light-emitting layers 4 in a first direction X. That is, the interval layer is arranged between any two adjacent subpixel regions in the first direction X. FIG. 1 and FIG. 2, for example, may be a sectional view along AA in FIG. 3.

In some embodiments, in the display panel provided by the embodiments of the present disclosure, the interval layer is arranged on the pixel defining layer between any two adjacent subpixels. Therefore, in the manufacturing process of the light-emitting layer, the peeling area is reduced as much as possible, and the peeling time is shortened.

Figure 4:
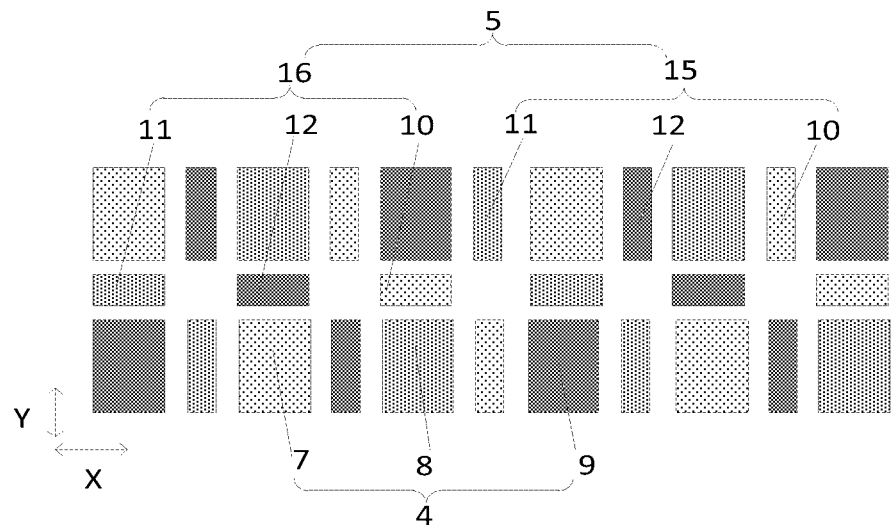
FIG. 4 is a schematic structural diagram of yet another display panel provided by an embodiment of the present disclosure.
Figure 5:
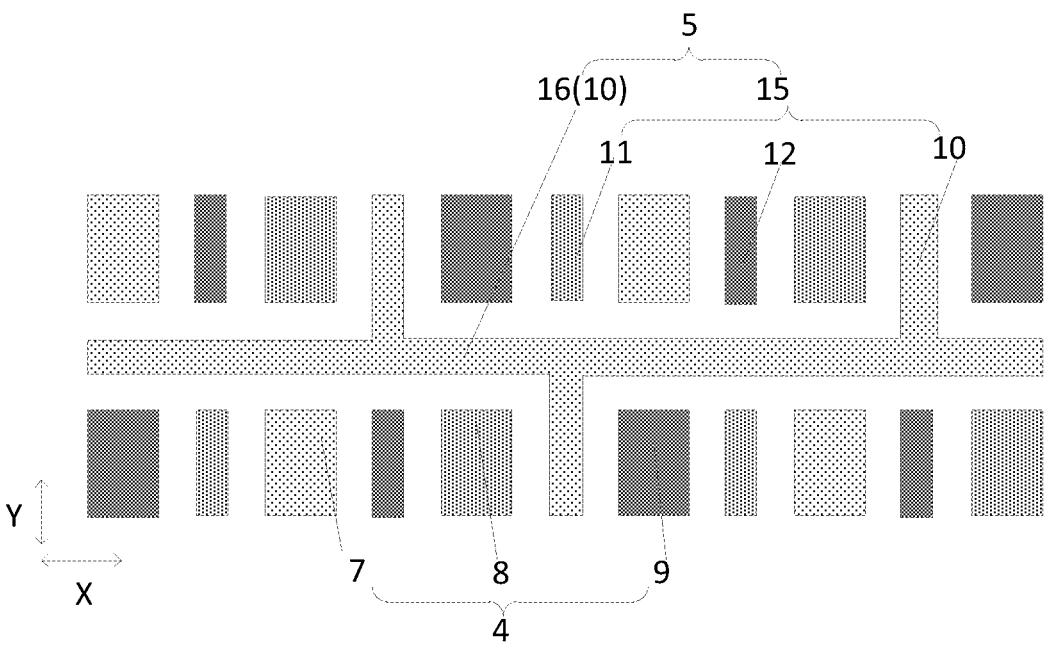
FIG. 5 is a schematic structural diagram of yet another display panel provided by an embodiment of the present disclosure.

In some embodiments, orthographic projections of the plurality of light-emitting layers and the plurality of interval layers on the substrate are as shown in FIG. 4 and FIG. 5, the plurality of interval layers 5 are arranged between the two adjacent light-emitting layers 4 in the first direction X and between two adjacent light-emitting layers 4 in a second direction Y respectively. That is, a part of the plurality of interval layers are arranged between any two adjacent subpixels regions in the first direction X, and the remaining interval layers are arranged between any two adjacent subpixels regions in the second direction Y.

In some embodiments, as shown in FIG. 1 to FIG. 5, a light-emitting material of the interval layer 5 is different from a light-emitting material of at least one light-emitting layer 4 adjacent to the interval layer 5.

In some embodiments, as shown in FIG. 3 and FIG. 4, the light-emitting material of the interval layer 5 is different from light-emitting materials of the light-emitting layers 4 adjacent the interval layer 5.

In some embodiments, the interval layer is arranged between part of the adjacent subpixels, as shown in FIG. 3, an interval layer 5 is arranged between any two adjacent light-emitting layers 4 in the first direction X, that is, an interval layer 5 is arranged between any two adjacent subpixels in the first direction X. As shown in FIG. 3, the plurality of light-emitting layers 4 include: the red light-emitting layer 7, the blue light-emitting layer 8 and the green light-emitting layer 9. The plurality of interval layer 5 include: the red light interval layer 10, the blue light interval layer 11 and the green light interval layer 12. The red light interval layer 10 is arranged between the blue light-emitting layer 8 and the green light-emitting layer 9 adjacent in the first direction X, the blue light interval layer 11 is arranged between the red light-emitting layer 7 and the green light-emitting layer 9 adjacent in the first direction X, and the green light interval layer 12 is arranged between the red light-emitting layer 7 and the blue light-emitting layer 8 adjacent in the first direction X.

In some embodiments, the interval layer is arranged between any two adjacent subpixels, as shown in FIG. 4, the plurality of opening regions are arranged in the first direction X and the second direction Y, and the first direction X intersects with the second direction Y.

The interval layer 5 includes: a first interval layer 15 located between two adjacent opening regions in the first direction X, and a second interval layer 16 located between two adjacent opening regions in the second direction Y.

That is, the first interval layer is arranged between adjacent subpixel columns, and the second interval layer is arranged between adjacent subpixel rows.

In some embodiments, as shown in FIG. 4, a light-emitting material of the first interval layer 15 and a light-emitting material of the light-emitting layer 4 adjacent to the first interval layer are different; and a light-emitting material of the second interval layer 16 and a light-emitting material of the light-emitting layer 4 adjacent to the second interval layer are different. The light-emitting layer 4 includes: the red light-emitting layer 7, the blue light-emitting layer 8 and the green light-emitting layer 9. The first interval layer 15 and the second interval layer 16 both include: the red light interval layer 10, the blue light interval layer 11 and the green light interval layer 12. The red light interval layer 10 is arranged between any pair of adjacent blue light-emitting layer 8 and green light-emitting layer 9, the blue light interval layer 11 is arranged between any pair of adjacent red light-emitting layer 7 and green light-emitting layer 9, and the green light interval layer 12 is arranged between any pair of adjacent red light-emitting layer 7 and blue light-emitting layer 8.

In the display panel provided by the embodiments of the present disclosure, the light-emitting material of the interval layer is different from the light-emitting material of the light-emitting layer adjacent to the interval layer, that is, the interval layer and the light-emitting layer made of the same light-emitting materials are not adjacent to each other. In a process of forming the light-emitting layer by adopting the peeling process, a distance between the subpixel opening formed on the isolation layer and the dummy pixel opening is long, and the manufacture of the dummy pixel opening is easily achieved.

Alternatively, in some embodiments, as shown in FIG. 5, the light-emitting materials of part of the interval layers 5 are different from the light-emitting materials of the light-emitting layer 4 adjacent thereto, and the light-emitting materials of the remaining interval layers 5 are different from the light-emitting materials of at least one light-emitting layer 4 adjacent thereto.

In some embodiments, as shown in FIG. 5, the plurality of opening regions are arranged in the first direction X and the second direction Y, and the first direction X intersects with the second direction Y.

The interval layer 5 includes: the first interval layer 15 arranged between any two adjacent opening regions in the first direction X, and the second interval layer 16 arranged between any two adjacent opening regions in the second direction Y.

That is, the first interval layer is arranged between the adjacent subpixel columns, and the second interval layer is arranged between the adjacent subpixel rows.

In some embodiments, as shown in FIG. 5, a light-emitting material of the first interval layer 15 is different from the light-emitting material of the light-emitting layer 4 adjacent thereto; and a light-emitting material of the second interval layer 16 is different from the light-emitting material of at least one light-emitting layer 4 adjacent to the second interval layer 6. light-emitting materials of a plurality of second interval layer 16 are the same and are integrally connected, and the plurality of second interval layer 16 is integrally connected to the first interval layer 15 having the same light-emitting materials as the plurality of second interval layer 16.

In some embodiments, as shown in FIG. 5, the light-emitting layer 4 includes: the red light-emitting layer 7, the blue light-emitting layer 8 and the green light-emitting layer 9. The first interval layer 15 includes: the red light interval layer 10, the blue light interval layer 11 and the green light interval layer 12. The red light interval layer 10 of the first interval layer 15 is arranged between the blue light-emitting layer 8 and the green light-emitting layer 9 adjacent in the first direction X, the blue light interval layer 11 of the first interval layer 15 is arranged between the red light-emitting layer 7 and the green light-emitting layer 9 adjacent in the first direction X, and the green light interval layer 12 of the first interval layer 15 is arranged between the red light-emitting layer 7 and the blue light-emitting layer 8 adjacent in the first direction X. The second interval layer 16 includes: the red light interval layer 10. The second interval layer 16 is integrally connected to the red light interval layer 10 of the first interval layer 15.

Of course, in some embodiments, the second interval layer may also include the blue light interval layer, and the second interval layer is integrally connected to the blue light interval layer of the first interval layer. Alternatively, in some embodiments, the second interval layer may also include the green light interval layer, and the second interval layer is integrally connected to the green light interval layer of the first interval layer.

In the display panel provided by the embodiments of the present disclosure, the second interval layer is integrally connected to the first interval layer having the same light-emitting material as the second interval layer. In the process of forming the light-emitting layer by adopting the peeling process, the peeling area may be further reduced, and the peeling time is shortened.

It should be noted that, in the display panel shown in FIG. 5 provided by the embodiments of the present disclosure, shapes of the plurality of opening regions are rectangular, of course, during specific implementation, the plurality of opening regions may also be in other shapes.

In some embodiments, as shown in FIG. 6, the display panel includes a red subpixel R, a blue subpixel B and a green subpixel G, a part of the plurality of opening regions of the pixel defining layer correspond to the red subpixel R and the blue subpixel B and are hexagonal in shape, and the remaining opening regions of the pixel defining layer corresponding to the green subpixel G, which include two opening sub-regions in pentagon shapes. The first interval layer 15 is arranged between adjacent subpixel columns in the first direction X, and the second interval layer 16 is arranged between adjacent subpixel rows in the second direction Y. The first interval layer 15 includes: the red light interval layer 10, the blue light interval layer 11 and the green light interval layer 12. The red light interval layer 10 of the first interval layer 15 is arranged between the blue subpixel B and the green subpixel G adjacent in the first direction X, the blue light interval layer 11 of the first interval layer 15 is arranged between the red subpixel R and the green subpixel G adjacent in the first direction X, and the green light interval layer 12 of the first interval layer 15 is arranged between the red subpixel R and the blue subpixel B adjacent in the first direction X. The second interval layer 16 includes: the red light interval layer 10. The second interval layer 16 is integrally connected to the red light interval layer 10 of the first interval layer 15.

In some embodiments, as shown in FIG. 1 and FIG. 2, the display panel further includes:

an anode 6, arranged on the substrate 1 in the plurality of opening regions 3; and a cathode 13, arranged on the light-emitting layer 4 and the interval layer 5.

In some embodiments, in the display panel provided by the embodiments of the present disclosure, a common layer may also be arranged between the light-emitting layer and the cathode, and the common layer between the light-emitting layer and the cathode, for example, includes a hole transport layer and a hole injection layer.

In some embodiments, the substrate of the display panel provided by the embodiments of the present disclosure includes: a base substrate, and each film layer of a thin film transistor pixel circuit located on the base substrate. In some embodiments, the thin film transistor pixel circuit, for example, includes a thin film transistor and a capacitor. Taking the thin film transistor of a top-gate structure as an example, the thin film transistor pixel circuit, for example, includes: an active layer, a first gate insulating layer arranged on the active layer, a first gate layer arranged on the first gate insulating layer, a second gate insulating layer arranged on the first gate layer, a second gate layer arranged on the second gate insulating layer, an interlayer insulating layer arranged on the second gate layer, and a source-drain electrode layer arranged on the interlayer insulating layer. The substrate further includes a planarization layer arranged on the source-drain electrode layer, and the anode and the pixel defining layer are arranged on the planarization layer. An encapsulation layer is further included on the cathode. The encapsulation layer, for example, includes an inorganic encapsulation layer, an organic encapsulation layer and an inorganic encapsulation layer which are arranged in a stacked mode.

Based on the same inventive concept, the embodiments of the present disclosure further provide a method for manufacturing a display panel, as shown in FIG. 7, including:

S101, providing a substrate;

S102, forming a pattern of a pixel defining layer having a plurality of opening regions arranged in an array on the substrate; and S103, forming a pattern of a light-emitting layer of each light-emitting material at least on the plurality of opening regions sequentially by adopting a peeling process, and while forming the pattern of the light-emitting layer of the each light-emitting material, forming a pattern of an interval layer on the pixel defining layer, where the interval layer is disconnected from the adjacent light-emitting layer.

In the method for manufacturing the display panel provided by the embodiments of the present disclosure, the light-emitting layer is formed by adopting the peeling process, meanwhile the pattern of the interval layer is formed, so that the peeling area can be reduced, the peeling time can be shortened, the damages to the light-emitting material in the peeling process are reduced, and at the same time, the interval layer is disconnected from the adjacent light-emitting layer, so as to avoid a color crossing problem between different subpixels and improve the display effect.

In some embodiments, before forming a pattern of a light-emitting layer of each light-emitting material at least on the plurality of opening regions sequentially by adopting a peeling process, and while forming the pattern of the light-emitting layer of the each light-emitting material, forming the pattern of the interval layer on the pixel defining layer, the method further includes:

forming a common layer covering the plurality of opening regions and the pixel defining layer by adopting an evaporation process.

In the manufacturing method for the display panel provided by the embodiments of the present disclosure, before the light-emitting layer is formed, the common layer which is arranged as a whole layer is formed. Compared with forming common layers corresponding to subpixels of different colors, the manufacturing process of the display panel may be simplified, manufacturing time of the display panel is saved, and costs are saved. Moreover, since the interval layer is disconnected from the adjacent light-emitting layer, even if the common layer between different subpixels is integrally formed, there will be no risk of color crossing.

In some embodiments, the step that sequentially forming the pattern of the light-emitting layer of the each light-emitting material on the plurality of opening regions by adopting the peeling process, includes:

forming the pattern of the light-emitting layer of the each light-emitting material is formed by sequentially adopting the following steps;

forming an isolation layer covering an opening region and the pixel defining layer;

forming a first opening in the open region corresponding to the light-emitting material of the light-emitting layer to be evaporated by performing a patterning process on the isolation layer;

forming the pattern of the light-emitting layer in the first opening and forming a light-emitting layer to be removed on the isolation layer by evaporating the light-emitting material in a whole surface mode; and peeling the isolation layer by adopting a peeling solution, so as to remove the light-emitting layer to be removed.

In some embodiments, the step that while forming the pattern of the light-emitting layer of the each light-emitting material, forming the pattern of the interval layer on the pixel defining layer, includes:

performing the patterning process on the isolation layer, and while forming the first opening in the opening region corresponding to the light-emitting material of the light-emitting layer to be evaporated, forming a second opening exposing part of the pixel defining layer, wherein the light-emitting material of the light-emitting layer corresponding to at least one opening region adjacent to the second opening is different from the light-emitting material of the light-emitting layer currently to be evaporated; and forming the pattern of the light-emitting layer in the first opening by evaporating the light-emitting material in the whole surface mode, and while forming the light-emitting layer to be removed on the isolation layer, forming the pattern of the interval layer in the second opening.

When forming the light-emitting layers of different light-emitting materials, the patterns of the first opening and the second opening formed on the isolation layer may correspond to the patterns of the light-emitting layer and interval layer of the corresponding light-emitting materials, please refer to the specific embodiments of the display panel section, which will not be repeated here.

Figure 8:
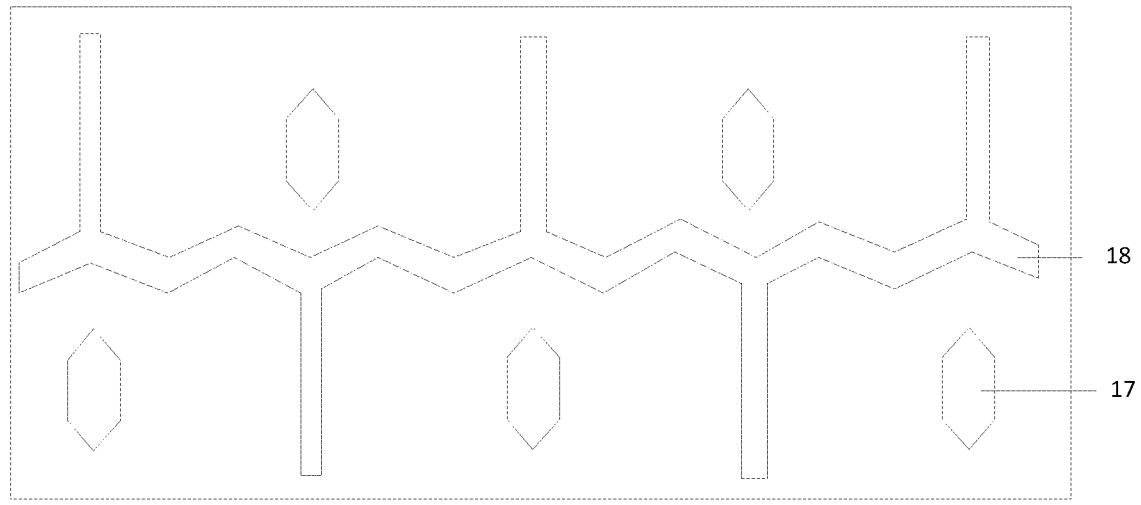
FIG. 8 is a schematic diagram of forming an opening of an isolation layer in a method of manufacturing a display panel provided by an embodiment of the present disclosure.

In some embodiments, the interval layer includes a first interval layer and a second interval layer. When the second interval layer includes a red light-emitting layer, and the red light-emitting layer of the second interval layer is integrally connected to a red light-emitting layer of the first interval layer, a top view after patterning the isolation layer, for example, may be as shown in FIG. 8, the isolation layer has a plurality of first openings 17 and a second opening 18, and each of the plurality of first openings 17 corresponds to a red subpixel.

In some embodiments, the step that the isolation layer covering the plurality of opening regions and the pixel defining layer is formed, includes:

sequentially forming a sacrificial layer and a photoresist layer arranged on the sacrificial layer.

The step that performing the patterning process on the isolation layer specifically includes:

an exposing and developing process is adopted for the photoresist layer, a developing process is adopted for the sacrificial layer, the first opening is formed in the open region corresponding to the light-emitting material of the light-emitting layer to be evaporated, and the second opening exposing part of the pixel defining layer is formed.

In some embodiments, the sacrificial layer includes a fluoroether material, and the peeling solution, for example, may include an organic solvent that dissolves the fluoroether material.

In some embodiments, before forming the pattern of the pixel defining layer having the opening regions arranged in an array on the substrate, the method further includes:

a pattern of the anode is formed on the substrate.

In some embodiments, after forming a pattern of a light-emitting layer of each light-emitting material at least on the plurality of opening regions sequentially by adopting a peeling process, and while forming the pattern of the light-emitting layer of the each light-emitting material, forming the pattern of the interval layer on the pixel defining layer, the method further includes:

forming the cathode by adopting the evaporation process.

Figure 9:
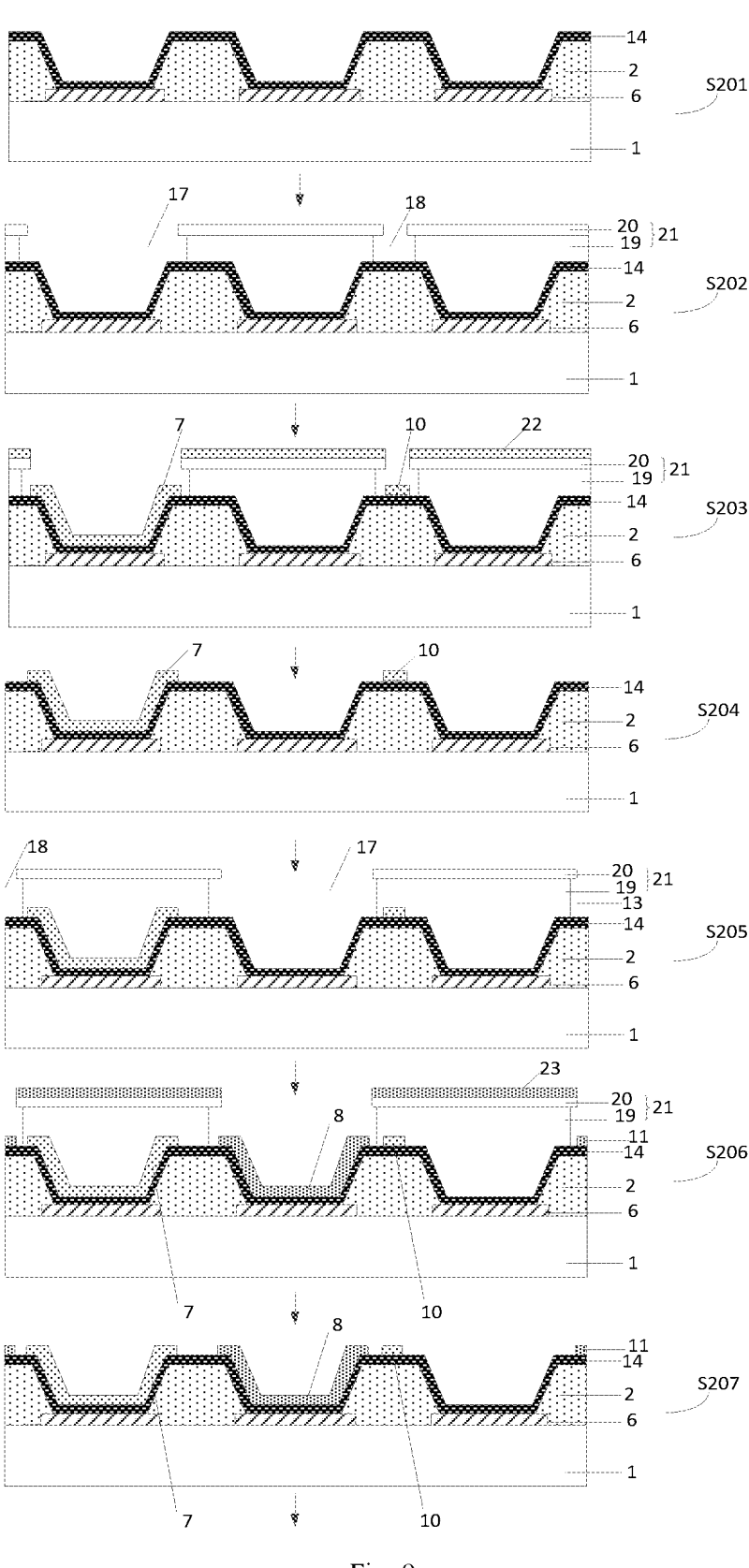
FIG. 9 and FIG. 10 are schematic diagrams of a method for manufacturing another display panel provided by an embodiment of the present disclosure.
Figure 10:
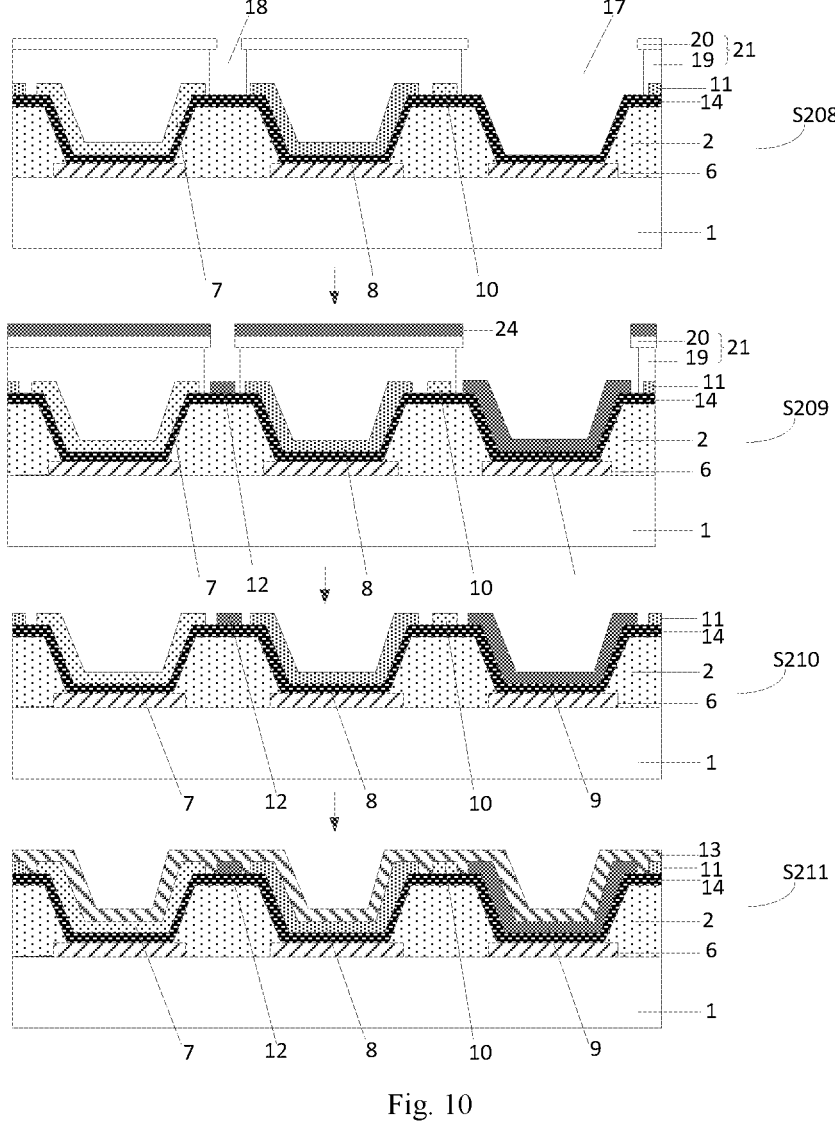

Next, taking the display panel including a red subpixel, a blue subpixel and a green subpixel as an example, the method for manufacturing the display panel provided by the embodiment of the present disclosure is described. As shown in FIG. 9 and FIG. 10, the manufacturing method for the display panel includes the following steps:

S201, providing a substrate 1, forming patterns of an anode 6 and a pixel defining layer 2 on the substrate 1, and forming a common layer 14 on the anode 6 and the pixel defining layer 2;

S202, forming an isolation layer 21 including a sacrificial layer 19 and a photoresist layer 20, and forming a first opening 17 and a second opening 18 on the isolation layer 21 by adopting a patterning process, where the first opening 17 corresponds to an opening region of the red subpixel, and the second opening 18 exposes part of the pixel defining layer 2;

S203, forming a pattern of a red light-emitting layer 7, a pattern of a red interval layer 10 and a red light-emitting layer 22 to be removed by evaporating a red light-emitting material;

S204, peeling the isolation layer by adopting a peeling solution, and meanwhile removing the red light-emitting layer to be removed on the isolation layer;

S205, forming an isolation layer 21 including a sacrificial layer 19 and a photoresist layer 20, and forming a first opening 17 and a second opening 18 on the isolation layer 21 by adopting a patterning process, wherein the first opening 17 corresponds to an open region of the blue subpixel, and the second opening 18 exposes part of the pixel defining layer 2;

S206, forming a pattern of a blue light-emitting layer 8, a pattern of a blue interval layer 11 and a blue light-emitting layer 23 to be removed by evaporating a blue light-emitting material;

S207, peeling the isolation layer by adopting the peeling solution, and meanwhile removing the blue light-emitting layer to be removed on the isolation layer;

S208, forming an isolation layer 21 including a sacrificial layer 19 and a photoresist layer 20, and forming an first opening 17 and an second opening 18 on the isolation layer 21 by adopting the patterning process, where the first opening 17 corresponds to an open region of the green subpixel, and the second opening 18 exposes part of the pixel defining layer 2;

S209, forming a pattern of a green light-emitting layer 9, a pattern of a green interval layer 12 and a green light-emitting layer 24 to be removed by evaporating a green light-emitting material;

S210, peeling the isolation layer by adopting the peeling solution, and meanwhile removing the green light-emitting layer to be removed on the isolation layer; and S211, forming a cathode by evaporating a cathode material.

The embodiments of the present disclosure provide a display device, including the display panel provided by the embodiment of the present disclosure.

The display device provided by the embodiments of the present disclosure is any product or component with a display function such as a mobile phone, a tablet computer, a television, a monitor, a notebook computer, a digital photo frame and a navigator. Other essential components of the display device should be understood by those skilled in the art, and will not repeated herein, nor should it be used as a limitation of the present disclosure. The implementation of the display device may refer to the implementation of the above display panel, and the repetition will not be made.

To sum up, in the display panel and the manufacturing method therefor, and the display device provided by the embodiments of the present disclosure, the light-emitting layer is formed by adopting the peeling process, meanwhile the pattern of the interval layer is further formed, so that the peeling area can be reduced, the peeling time can be shortened, the damages to the light-emitting material in the peeling process are reduced, at the same time, the interval layer is disconnected from the adjacent light-emitting layer, so as to avoid the color crossing problem between different subpixels and improve the display effect.

Obviously, those skilled in the art can make various modifications and variations to the present disclosure without departing from the spirit and scope of the present disclosure. As such, provided that these modifications and variations of the present disclosure fall within the scope of the claims of the present disclosure and their equivalents, the present disclosure is also intended to cover such modifications and variations.

What is claimed is:

1. A display panel, comprising:

a substrate;

a pixel defining layer, arranged on the substrate, and comprising a plurality of opening regions arranged in an array;

a light-emitting layer, arranged on the substrate at least in the plurality of opening regions; and an interval layer, arranged on the pixel defining layer and disconnected from an adjacent light-emitting layer;

wherein a light-emitting material of the interval layer is different from a light-emitting material of at least one light-emitting layer adjacent to the interval layer;

wherein the plurality of opening regions are arranged in a first direction and a second direction, and the first direction intersects with the second direction; and the interval layer comprises: a first interval layer arranged between two adjacent opening regions in the first direction, and a second interval layer arranged between two adjacent opening regions in the second direction;

wherein a light-emitting material of the first interval layer is different from a light-emitting material of a light-emitting layer adjacent to the first interval layer; and light-emitting materials of a plurality of second interval layers are the same, the plurality of second interval layers are integrally connected, and the plurality of second interval layers are integrally connected to the first interval layer having a same light-emitting material as the plurality of second interval layers.

2. The display panel according to claim 1, further comprising:

a common layer, arranged between the substrate and the light-emitting layer and between the pixel defining layer and the interval layer.

3. The display panel according to claim 1, wherein the light-emitting material of the interval layer is different from the light-emitting material of the light-emitting layer adjacent to the interval layer.

4. The display panel according to claim 1, wherein a size of a gap between the adjacent light-emitting layer and the interval layer ranges from 1 micrometer to 2 micrometers.

5. A display device, comprising a display panel, wherein the display panel comprises:

a substrate;

a pixel defining layer, arranged on the substrate, and comprising a plurality of opening regions arranged in an array;

a light-emitting layer, arranged on the substrate at least in the plurality of opening regions; and an interval layer, arranged on the pixel defining layer and disconnected from an adjacent light-emitting layer;

wherein a light-emitting material of the interval layer is different from a light-emitting material of at least one light-emitting layer adjacent to the interval layer;

wherein the plurality of opening regions are arranged in a first direction and a second direction, and the first direction intersects with the second direction; and the interval layer comprises: a first interval layer arranged between two adjacent opening regions in the first direction, and a second interval layer arranged between two adjacent opening regions in the second direction;

wherein a light-emitting material of the first interval layer is different from a light-emitting material of a light-emitting layer adjacent to the first interval layer; and light-emitting materials of a plurality of second interval layers are the same, the plurality of second interval layers are integrally connected, and the plurality of second interval layers are integrally connected to the first interval layer having a same light-emitting material as the plurality of second interval layers.

* * * * *